Ｕ S010444298B2

United States Patent
Hata et al.

(10) Patent No.: US 10,444,298 B2
(45) Date of Patent: Oct. 15, 2019

(54) MAGNETIC NOISE REJECTION APPARATUS AND MAGNETIC FIELD MEASUREMENT APPARATUS

(71) Applicant: ADVANTEST CORPORATION, Tokyo (JP)

(72) Inventors: Yoshiyuki Hata, Tokyo (JP); Yuji Ogata, Tokyo (JP); Takeshi Tanaka, Tokyo (JP); Toshiaki Hayakawa, Tokyo (JP)

(73) Assignee: ADVANTEST CORPORATION, Tokyo (JP)

( * ) Notice: Subject to any disclaimer, the term of this patent is extended or adjusted under 35 U.S.C. 154(b) by 0 days.

(21) Appl. No.: 15/388,084

(22) Filed: Dec. 22, 2016

(65) Prior Publication Data

US 2017/0219661 A1    Aug. 3, 2017

(30) Foreign Application Priority Data

Jan. 29, 2016   (JP) ................................ 2016-015468

(51) Int. Cl.
    *G01R 33/00*    (2006.01)
(52) U.S. Cl.
    CPC ..... *G01R 33/0041* (2013.01); *G01R 33/0029* (2013.01)
(58) Field of Classification Search
    CPC ........................ G01R 33/0041; G01R 33/0029
    See application file for complete search history.

(56) References Cited

U.S. PATENT DOCUMENTS

| 3,967,064 | A | * | 6/1976 | Sigworth | ............. | G01D 5/2216 |
| | | | | | | 307/650 |
| 5,465,012 | A | * | 11/1995 | Dunnam | ................ | H04B 15/00 |
| | | | | | | 307/91 |
| 9,030,197 | B1 | * | 5/2015 | Meske | ............... | G01R 33/0017 |
| | | | | | | 324/225 |
| 2004/0095126 | A1 | * | 5/2004 | Kudo | ................... | G01R 15/148 |
| | | | | | | 324/117 R |
| 2008/0290859 | A1 | * | 11/2008 | LaCroix | ................. | G01R 33/02 |
| | | | | | | 324/207.13 |
| 2009/0184709 | A1 | | 7/2009 | Kajola et al. | | |
| 2010/0127655 | A1 | * | 5/2010 | Ward | .................... | G05B 11/011 |
| | | | | | | 318/621 |
| 2011/0133733 | A1 | * | 6/2011 | Nagasaki | ............. | G01R 33/063 |
| | | | | | | 324/252 |
| 2015/0150475 | A1 | | 6/2015 | Varcoe | | |

FOREIGN PATENT DOCUMENTS

| JP | 2003-149311 | 5/2003 |
| JP | 2003-167038 | 6/2003 |
| JP | 2006-296829 | 11/2006 |
| JP | 2007-522465 | 8/2007 |
| JP | 2012-95939 | 5/2012 |
| JP | 2015-525596 | 9/2015 |

* cited by examiner

*Primary Examiner* — Akm Zakaria

(57) ABSTRACT

There is provided a magnetic noise rejection apparatus which includes: a plurality of cancellation coils arranged near a target object; a plurality of magnetic sensors disposed inside the respective cancellation coils; an adder circuit configured to take a sum of outputs of the plurality of magnetic sensors; and a feedback control circuit configured to supply the cancellation coils with such a common feedback drive current that the sum of the outputs of the magnetic sensors is equal to a sum of outputs of the magnetic sensors under a zero magnetic field.

9 Claims, 15 Drawing Sheets

US 10,444,298 B2

MAGNETIC NOISE REJECTION APPARATUS AND MAGNETIC FIELD MEASUREMENT APPARATUS

CROSS-REFERENCE TO RELATED APPLICATIONS

This application is based upon and claims the benefit of priority of the prior Japanese Patent Application No. 2016-15468, filed on Jan. 29, 2016, the entire contents of which are incorporated herein by reference.

BACKGROUND OF THE INVENTION

1. Field of the Invention

The embodiments discussed herein are related to a magnetic noise rejection apparatus which eliminates magnetic noise with use of coils arranged near a target object, and a magnetic field measurement apparatus using the magnetic noise rejection apparatus.

2. Description of the Related Art

In the measurement of a faint magnetic field, a method has conventionally been employed in which an object to be measured is put in a magnetic shield chamber enclosed by a material having a large magnetic permeability such as permalloy, and an external magnetic field is prevented from entering the magnetic shield chamber.

Also, as another method of preventing the entrance of the external magnetic field, active magnetic shielding is available in which an external magnetic field entering from the outside is detected by a sensor, and the external magnetic field is canceled out by driving magnetic field cancellation coils provided around a measurement chamber. The related techniques are described in, for example, Japanese Laid-open Patent Publication Nos. 2012-095939, 2003-167038, and 2003-149311, and Japanese Patent Translation Publication No. 2015-525596.

SUMMARY OF THE INVENTION

In the conventional configuration which employs a magnetic shield chamber, the apparatus configuration is large in size and weight. For this reason, it is difficult to employ the techniques under conditions where the apparatus needs to be carried outside a room or to apply the apparatus to a wearable sensor which puts a magnetic sensor directly on the body.

In addition, in the conventional active magnetic shielding, the position of a magnetic sensor which measures a magnetic field entering from the outside is different from the position of a measurement magnetic sensor which detects a magnetic field of a measurement target object. This disadvantageously increases a magnetic noise component of the measurement magnetic sensor, leading to a problem that the measurement of a faint magnetic field is difficult.

Given the situation above, an object of the present invention is to provide a magnetic noise rejection apparatus and a magnetic field measurement apparatus which are capable of separating a faint magnetic field to be measured from a relatively strong magnetic noise component and then measuring the faint magnetic field, and which are usable while being carried.

An aspect of the disclosure described below provides a magnetic noise rejection apparatus including: a plurality of cancellation coils arranged near a target object; a plurality of magnetic sensors disposed inside the respective cancellation coils; an adder circuit configured to take a sum of outputs of the plurality of magnetic sensors; and a feedback control circuit configured to supply the cancellation coils with such a common feedback drive current that the sum of the outputs of the magnetic sensors is equal to a sum of outputs of the magnetic sensors under a zero magnetic field.

Another aspect provides a magnetic field measurement apparatus including: a plurality of cancellation coils arranged near a target object; a plurality of magnetic sensors disposed inside the respective cancellation coils; an adder circuit configured to take a sum of outputs of the plurality of magnetic sensors; a feedback control circuit configured to supply the cancellation coils with such a common feedback drive current that the sum of the outputs of the magnetic sensors becomes equal to a sum of outputs of the magnetic sensors under a zero magnetic field; and a measurement circuit configured to detect a magnetic field generated from the target object based on output values of the individual magnetic sensors.

Still another aspect provides a magnetic field measurement apparatus including: a plurality of cancellation coils arranged near a target object; a plurality of magnetic sensors disposed inside the respective cancellation coils; an adder circuit configured to output a total value of outputs of the magnetic sensors; a feedback control circuit configured to supply the cancellation coils with such a common feedback drive current that the total value of the outputs of the magnetic sensors is equal to a total value of outputs of the magnetic sensors under a zero magnetic field; and a measurement circuit configured to detect a magnetic field generated from a location away from the target object based on the feedback drive current of the feedback control circuit.

The magnetic noise rejection apparatus and the magnetic field measurement apparatus according to the aspects described above eliminate a magnetic field generated near a group of a plurality of magnetic sensors by taking the sum of the outputs of these magnetic sensors. Then, the cancellation coils are driven based on the sum of the outputs of these magnetic sensors to eliminate an external magnetic field as a common component of the group of magnetic sensors using the magnetic field from the cancellation coils.

This makes it possible to achieve reduction in size and weight. In addition, the magnetic noise rejection apparatus and the magnetic field measurement apparatus are preferable for measuring the faint magnetic field because a reference magnetic sensor serves also as the measurement magnetic sensor, making it possible to prevent the increase in a noise component.

DESCRIPTION OF THE PREFERRED EMBODIMENTS

Basic preludes are described prior to the description of embodiments.

Figure 1:
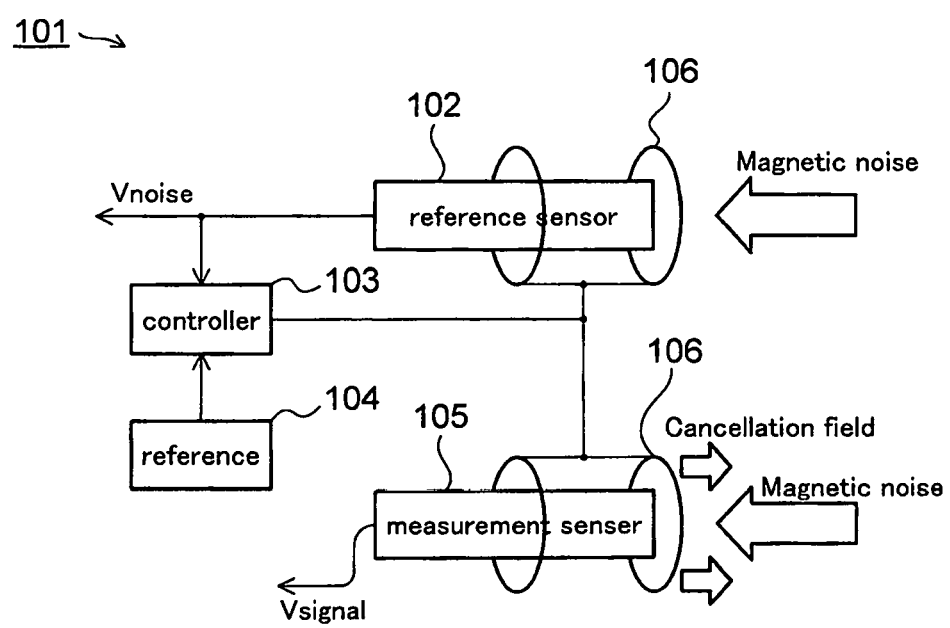
FIG. 1 is a block diagram of an active magnetic noise rejection apparatus according to preludes.

FIG. 1 is a block diagram of an active magnetic noise rejection apparatus according to the conventional technology.

An active magnetic noise rejection apparatus 101 according to the conventional technology is provided with a reference sensor 102 for detecting a magnetic field entering from the outside and a measurement sensor 105 which detects a magnetic field from a measurement target.

Each of the reference sensor 102 and the measurement sensor 105 is provided with a coil 106 for eliminating magnetic noise. The coil 106 generates a magnetic field which cancels out the magnetic field entering from the outside according to a detection value (Vnoise) of the reference sensor 102.

In other words, an intensity of the external magnetic field detected by the reference sensor 102 is inputted to a controller 103. The controller 103 compares a reference value under the zero magnetic field outputted from a reference voltage source 104 with an output of the reference sensor 102, and supplies a feedback drive current in accordance with the result of comparison to the coils 106.

Thus, the magnetic fields which cancel out the magnetic noise component entering from the outside are generated from the coils 106, and magnetic field noise around the measurement sensor 105 is also removed.

However, there is a problem that it is impossible to achieve sufficient noise removal performance in the case of measuring a faint magnetic field such as a magnetic field generated from a living body, for example, even when the magnetic noise rejection apparatus 101 is used.

Figure 2A:
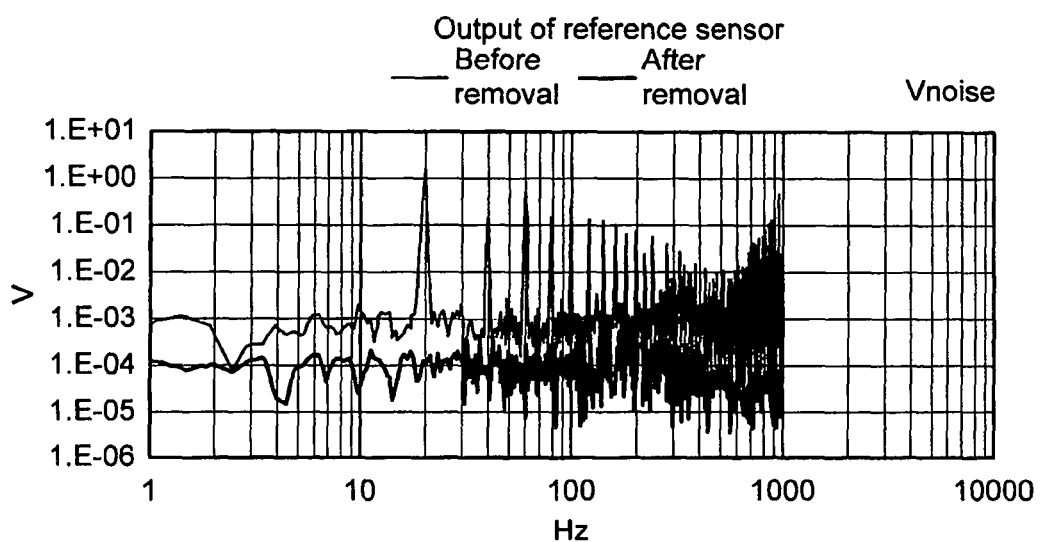
FIG. 2A is a diagram illustrating noise components of a reference sensor of FIG. 1.
Figure 2B:
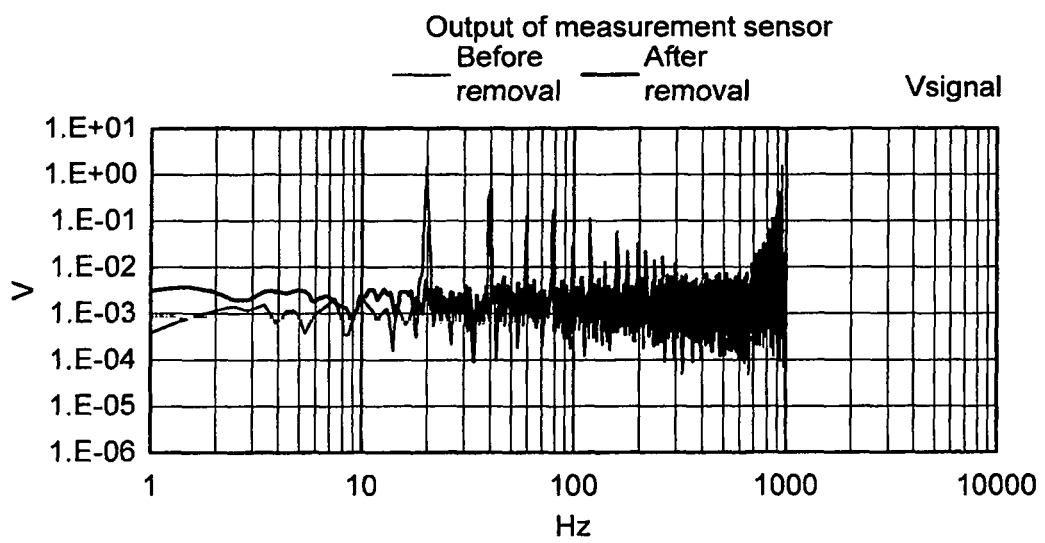
FIG. 2B is a diagram illustrating noise components of a measurement sensor of FIG. 1.

FIG. 2A is a diagram illustrating noise components of the reference sensor of FIG. 1, and FIG. 2B is a diagram illustrating noise components of the measurement sensor of FIG. 1. In the figures, the thin lines represent noise components before drive currents are supplied to the coils 106 to perform noise removal, while the thick lines represent the results after the drive currents are supplied to the coils 106 to perform noise rejection.

As illustrated in FIG. 2A, the noise level of the reference magnetic sensor 102 is lower after the noise removal is performed than before the noise removal is performed.

As illustrated in FIG. 2B, in contrast, the noise level of the measurement magnetic sensor 105 does not differ much before and after the noise removal, leading to a problem that the measurement of a faint magnetic field is difficult.

Hereinbelow, the embodiments are described.

First Embodiment

Figure 3:
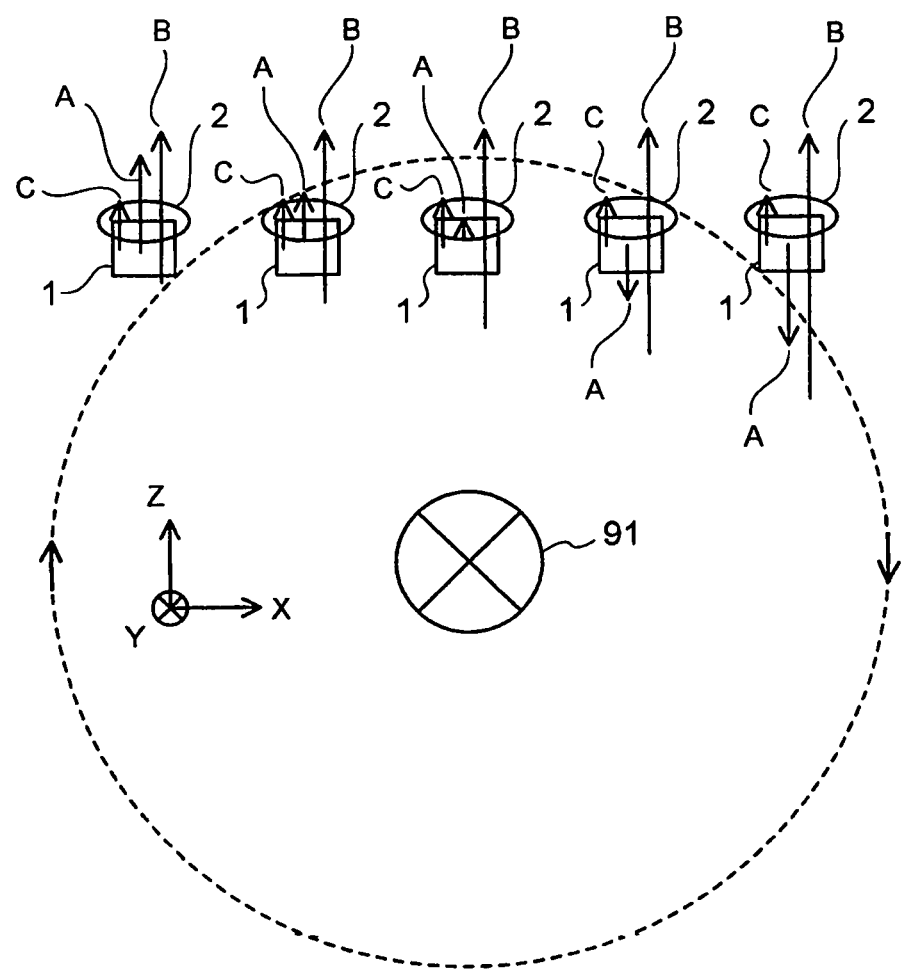
FIG. 3 is a diagram illustrating magnetic field acting on a magnetic noise rejection apparatus according to an embodiment.

FIG. 3 is a diagram illustrating a magnetic field acting on magnetic sensors and cancellation coils of a magnetic noise rejection apparatus according to a first embodiment.

As illustrated in FIG. 3, the magnetic noise rejection apparatus according to the embodiment has a plurality of cancellation coils 2 installed near a target object 91 to cancel out the magnetic field entering from the outside using the magnetic field generated from the cancellation coils 2.

Each of the cancellation coils 2 is provided with a magnetic sensor 1. The outputs of the cancellation coils 2 are controlled based on the outputs of the magnetic sensors 1.

As illustrated in the figure, consider the case where the current flows through the target object 91 toward the back side of the sheet. In this case, a magnetic field indicated by the dashed line in the figure is generated around the target object 91. Each of the magnetic sensors 1 detects magnetic field components in two directions, namely, an up and down directions in the figure. In the case of this example, a magnetic field having a component indicated by arrow A acts on each magnetic sensor 1.

In addition, alternating magnetic field components generated from a commercial power source, an electrical device near around, or the like act on the magnetic sensors 1 as indicated by arrows B, and furthermore, DC magnetic field components of the Earth's magnetic field act on the magnetic sensors 1 as indicated by arrows C.

The components indicated by arrows B and C described above are noise components in the case where the magnetic field of the target object 91 is measured. These noise components are generated at positions away from the target object 91 and have a tendency to emerge as components common to the group of all the magnetic sensors.

On the other hand, as for the magnetic field from the target object 91 disposed at a position closer to the group of magnetic sensors than the noise components of the external magnetic field, the positive and negative components cancel each other out when the sum is taken over the outputs of the magnetic sensors 1. As a result, the sum of the outputs of the group of magnetic sensors is almost zero.

Hence, the residual components after the sum is taken over the outputs of all the magnetic sensors 1 reflect the external magnetic field noise.

With this taken into consideration, the embodiment obtains the residual components after the sum is taken over the outputs of the magnetic sensors 1, and supplies each of the cancellation coils 2 with such a common drive current the sum becomes zero.

Figure 4:
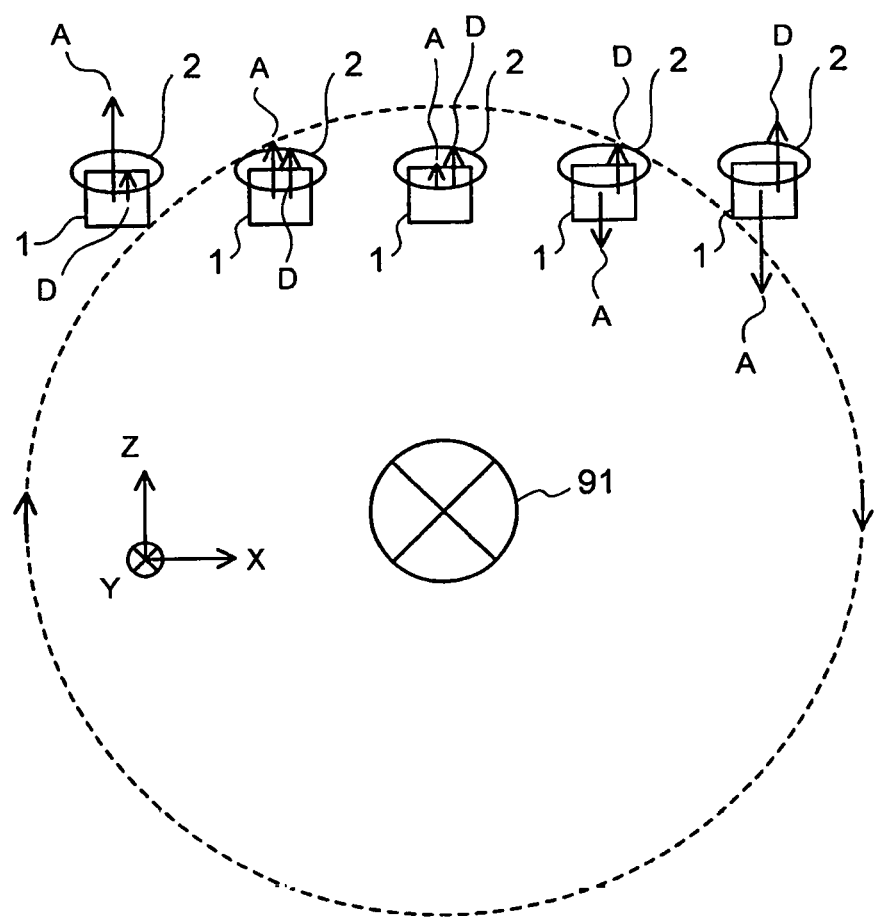
FIG. 4 is a diagram illustrating operation of the magnetic noise rejection apparatus according to the embodiment.

FIG. 4 is a diagram illustrating a distribution of the magnetic components of the magnetic sensors 1 when each cancellation coil 2 is supplied with such a drive current that the sum of the outputs of the magnetic sensors 1 becomes zero.

FIG. 4 illustrates removal of most of the noise components of the Earth's magnetic field and the alternating magnetic field, which are the common magnetic noise components entering the sensors. Only minor magnetic noise components (arrows D) having different intensities remain in the sensors.

On the other hand, the components (arrows A) whose sum of the outputs of all the magnetic sensors 1 becomes zero are not eliminated and remain unchanged, typically, such components are the magnetic field components from the target object 91.

As a result, the magnetic field (arrows A) from the target object 91 becomes relatively strong in the magnetic sensors 1. Thus, the magnetic noise entering from the outside is substantially removed from the group of magnetic sensors and also from the target object 91 disposed near the group magnetic sensors.

In addition, investigation of the output values of the individual magnetic sensors 1 makes it possible to obtain information on the magnetic field of the target object 91.

Hereinbelow, description is provided for a detailed configuration of a magnetic noise rejection apparatus 10 according to the embodiment.

Figure 5:
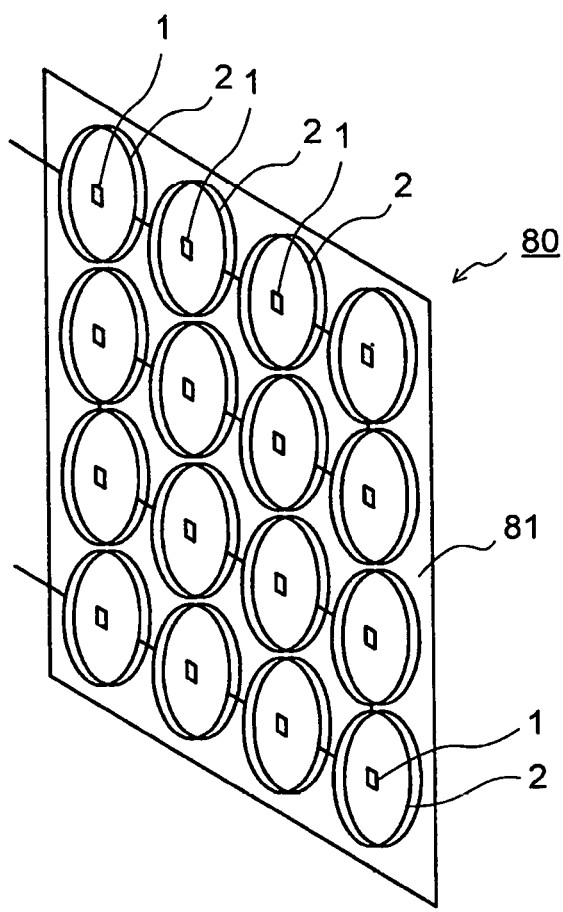
FIG. 5 is a perspective view illustrating a sensor unit on which cancellation coils and magnetic sensors are arranged.
Figure 6:
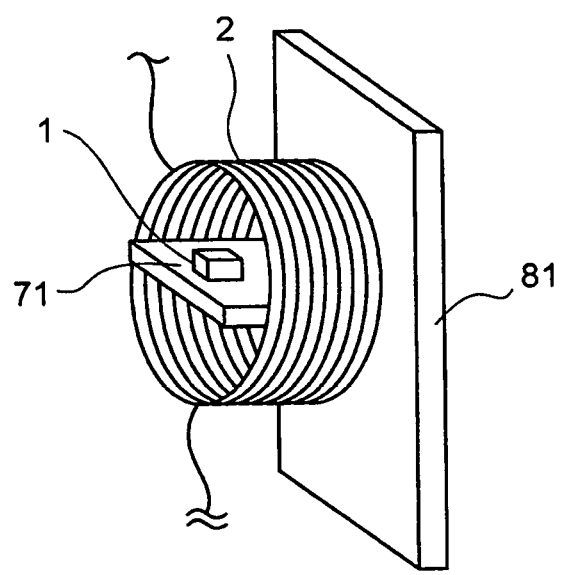
FIG. 6 is an enlarged perspective view of the cancellation coil and the magnetic sensor of FIG. 5.

FIG. 5 is a diagram illustrating a sensor unit 80, which is a collection of the cancellation coils 2 and the magnetic sensors 1 of FIG. 3. FIG. 6 is an enlarged perspective view of one cancellation coil 2 and one magnetic sensor 1.

In the example illustrated in FIG. 5, the cancellation coils 2 are arranged in the form of a grid on a support 81. One magnetic sensor 1 is disposed approximately at the center of the corresponding cancellation coil 2.

The support 81 may be made of any non-magnetic substance. For example, the sensor unit 80 can be applied to a wearable biomagnetic sensor when the support 81 is made of garment cloth or the like.

As illustrated in the enlarged perspective view of FIG. 6, a sensor support member 71 made of a non-magnetic material is joined on the support 81, and the magnetic sensor 1 is mounted on the sensor support member 71.

The cancellation coil 2 is formed along a circle having the magnetic sensor 1 as the center. For example, the cancellation coil 2 can be formed by winding wiring material on a cylindrical resin sheet and fixing the wiring material with a tape or the like. The cancellation coil 2 thus formed is fixed and held on the support 81.

The sensor unit 80 described above is driven by a control circuit to be described below.

Figure 7:
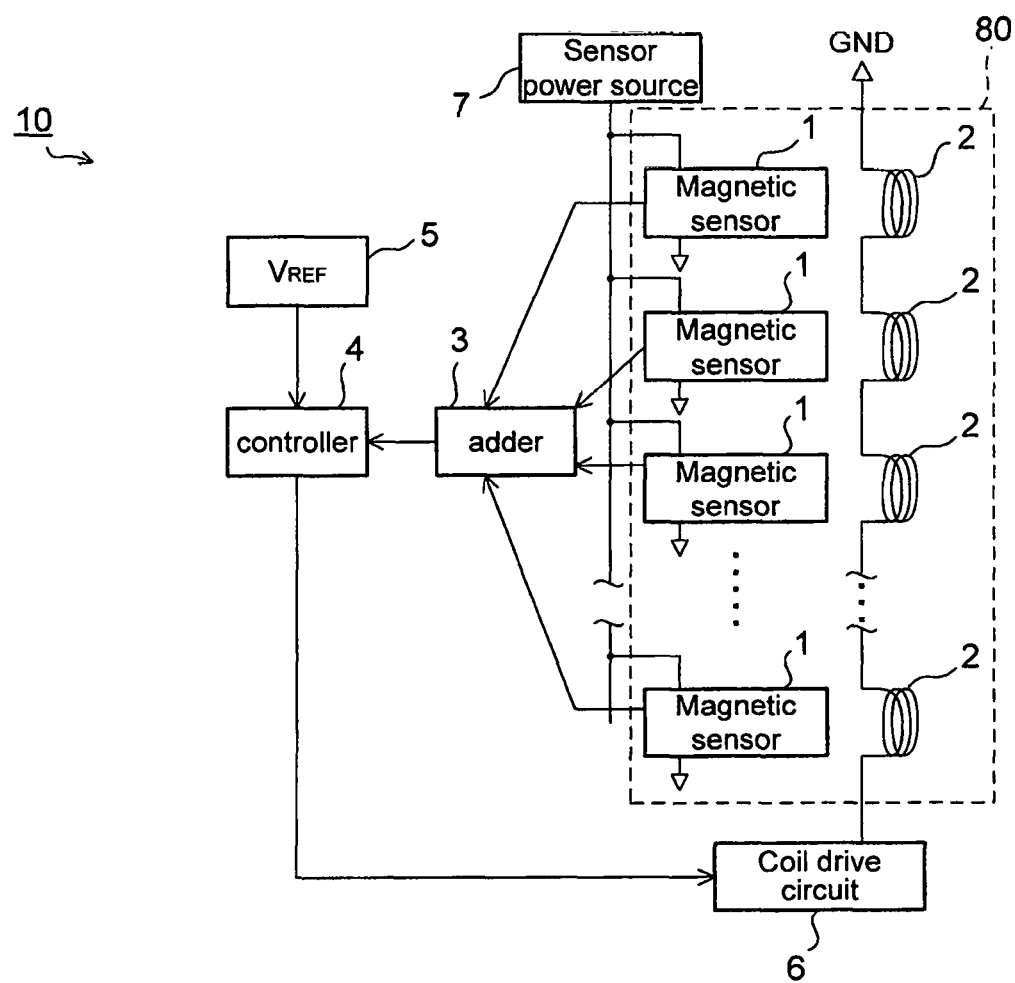
FIG. 7 is a block diagram of a magnetic noise rejection apparatus according to a first embodiment.

FIG. 7 is a block diagram of the magnetic noise rejection apparatus 10 according to the first embodiment.

As illustrated in FIG. 7, the output signals of a plurality of magnetic sensors 1 are inputted to an adder circuit 3, and the sum is taken over the outputs of the sensors in the adder circuit 3. The processing of the adder circuit 3 leaves only the magnetic noise components generated at positions away from the sensor unit 80, and the output voltage is inputted to a controller 4.

The controller 4 compares a reference voltage inputted from a voltage reference circuit 5 with an output value of the adder circuit 3. Here, the reference voltage of the voltage reference circuit 5 has been set to a value equal to the sum of the output values of all the magnetic sensors 1 under the zero magnetic field.

The controller 4 performs negative feedback control based on the reference voltage.

For example, in the case where the output value of the adder circuit 3 is greater than the reference voltage, or in other words in the case where the magnetic field components from the outside are positive, a negative drive voltage to cancel out the output value is outputted to a coil drive circuit 6. In addition, in the case where the output value of the adder circuit 3 is less than the reference voltage, a positive drive voltage to cancel out the output value is outputted to the coil drive circuit 6.

Note that the controller 4 may perform proportional-integral-derivative (PID) control, not simple comparison control of comparing with the reference value. In this case, for example, it is possible to shift away the frequency at which the noise components reach the peak to a higher frequency by setting small a time constant for the I-control when the measurement is to be performed in a low-frequency range. Thus, the measurement accuracy can be improved.

For example, the coil drive circuit 6 includes a voltage-to-current conversion circuit and the like, and outputs a current depending on the output voltage of the controller 4 to the cancellation coils 2.

Note that although the coil drive circuit 6 may be provided to each cancellation coil 2, the embodiment is configured such that all the cancellation coils 2 are connected in series and driven by one coil drive circuit 6.

It is preferable to drive the group of magnetic coils with one coil drive circuit 6 as in the embodiment because noise superposition attributed to the drive circuit is better suppressed than in the case of using a plurality of coil drive circuits 6.

Moreover, in the embodiment, a common sensor power source 7 drives all the magnetic sensors 1, as illustrated in the figure. This configuration is advantageous in that it becomes easy to remove noise attributed to signal processing in the case of obtaining measurement data because noise of the sensor power source 7 enters all the magnetic sensors 1 in a common manner.

The magnetic noise rejection apparatus 10 as described above can prevent entrance of the external magnetic field with an apparatus configuration very light in weight without use of a shield chamber made of a heavy soft magnetic metal, and thus, is applicable to a wearable biomagnetic sensor, for example.

Second Embodiment

Figure 8:
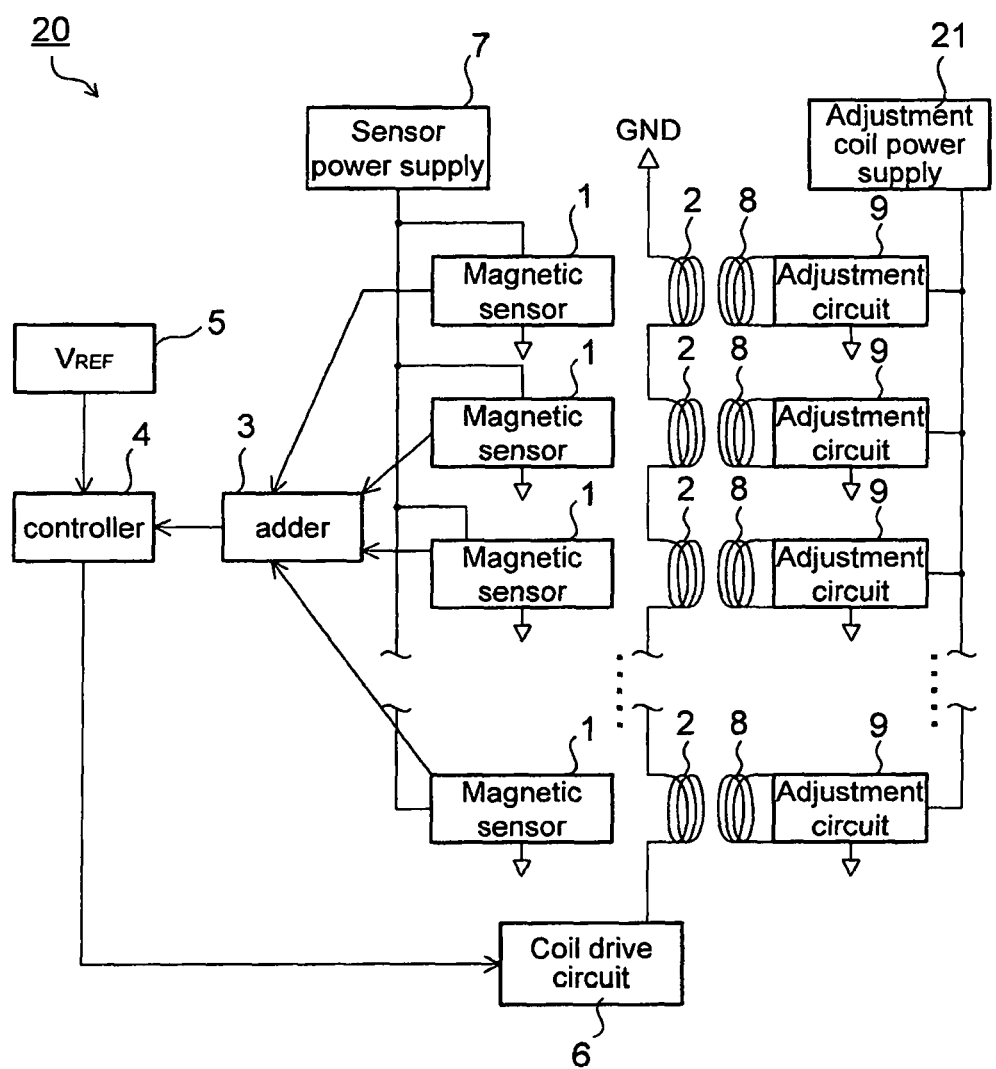
FIG. 8 is a block diagram of a magnetic noise rejection apparatus according to a second embodiment.

FIG. 8 is a block diagram of a magnetic noise rejection apparatus 20 according to a second embodiment. Note that the components of the magnetic noise rejection apparatus 20 the same as those of the magnetic noise rejection apparatus 10 of FIG. 7 are denoted by the same reference signs, and detailed description thereof is omitted.

As illustrated in the figure, the magnetic noise rejection apparatus 20 of the embodiment is different from the magnetic noise rejection apparatus 10 in that the magnetic noise rejection apparatus 20 is provided with offset adjustment coils 8 and adjustment circuits 9 for the offset adjustment coils 8.

Figure 9:
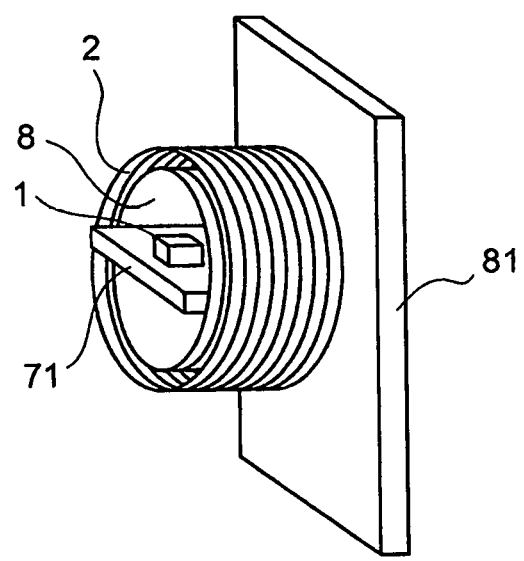
FIG. 9 is a perspective view of a magnetic sensor and an offset adjustment coil of FIG. 8.

FIG. 9 is a perspective view illustrating how the magnetic sensor 1, the cancellation coil 2, and the offset adjustment coil 8 are disposed relative to one another.

In the example illustrated in FIG. 9, the offset adjustment coil 8 is disposed on the inner peripheral side of the cancellation coil 2 and fixed to the support 81. Note that the embodiment is not limited to this arrangement. Namely, it is sufficient to dispose the offset adjustment coil 8 at a position where the magnetic force reaches the magnetic sensor 1. For example, the offset adjustment coil 8 may be disposed on the outer peripheral side of the cancellation coil 2.

As illustrated in FIG. 8, each of the magnetic sensors 1 is provided with one offset adjustment coil 8. The offset adjustment coil 8 is configured to compensate an offset value of an output of the magnetic sensor 1 with respect to the zero magnetic field when an appropriate magnetic field is applied to the magnetic sensor 1.

These offset adjustment coils 8 are connected to a common adjustment coil power source 21 via the adjustment circuits 9. It is possible to prevent noise superposition by providing a power source common to the offset adjustment coils 8 as mentioned above, thereby making it possible to easily remove noise components concentrating at a particular frequency using software.

The adjustment circuits 9 supply predetermined currents adjusted in accordance with the characteristics of the individual magnetic sensors 1 to the corresponding offset adjustment coils 8.

According to the embodiment, since the offset values of the magnetic sensors 1 are compensated for, it is possible to reduce residual noise components resulting from the variation of the characteristics of the magnetic sensors 1.

Note that the embodiment is not limited to the offset adjustment coils 8. The embodiment may be configured to compensate the offset values of the magnetic sensors 1 using a magnetic field of a permanent magnet provided near each of the magnetic sensors. In this case, it suffices to magnetize the permanent magnet disposed near the magnetic sensor 1 to predetermined magnetic field intensity based on the offset values of the magnetic sensors 1 measured in advance.

Third Embodiment

Figure 10:
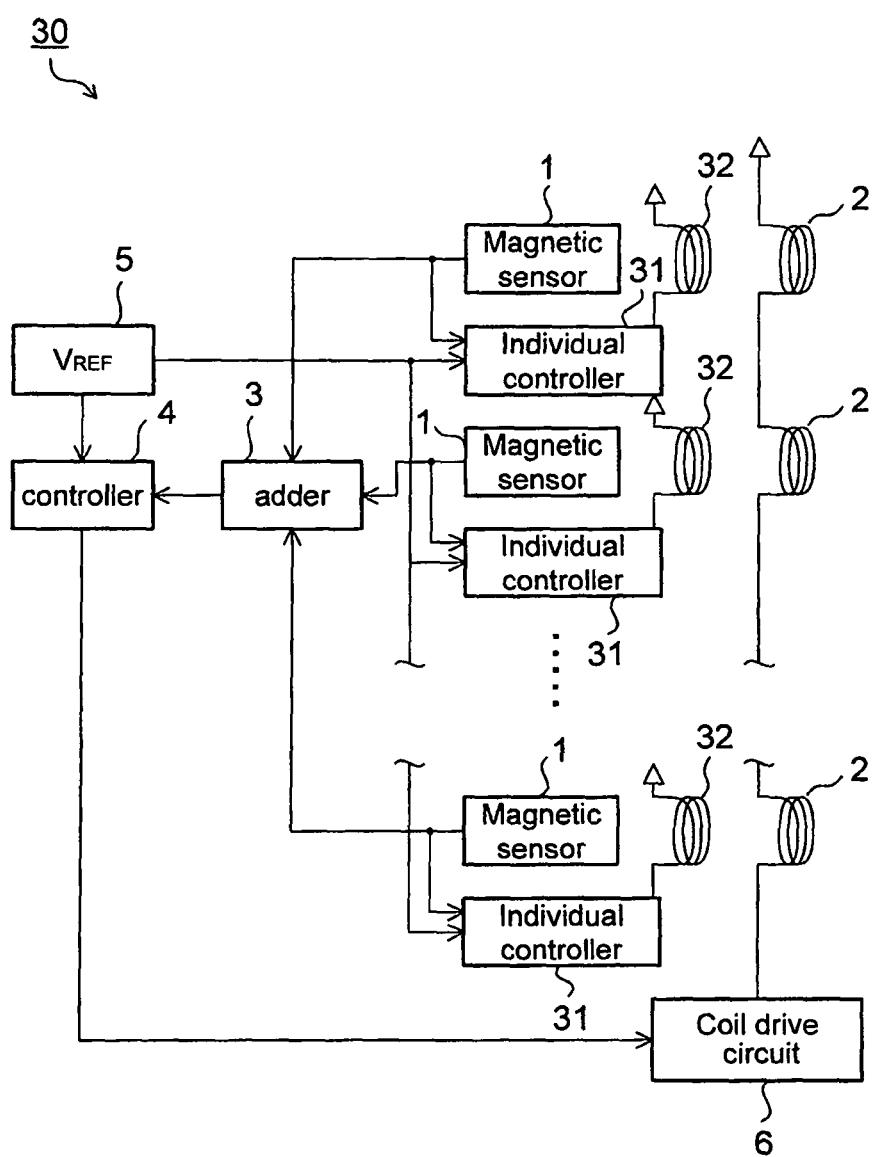
FIG. 10 is a block diagram of a magnetic noise rejection apparatus according to a third embodiment.

FIG. 10 is a block diagram of a magnetic noise rejection apparatus 30 according to a third embodiment.

Note that the components of the magnetic noise rejection apparatus 30 the same as those of the magnetic noise rejection apparatus 10 of FIG. 7 are denoted by the same reference signs, and detailed description thereof is omitted. In addition, illustration of a power system is omitted.

As illustrated in FIG. 10, the magnetic noise rejection apparatus 30 of the embodiment is provided with second feedback loops for the individual magnetic sensors 1, apart from an entire feedback loop including the group of the plurality of magnetic sensors.

Each of the second feedback loops includes the magnetic sensor 1, an individual controller 31, and a DC component compensation coil 32, and removes noise components which cannot completely be eliminated by the processing of simply taking the sum of the magnetic sensors 1.

An example of the noise components described above is non-uniform components of the Earth's magnetic field between the magnetic sensors 1, which emerge because, for instance, the magnetic sensors 1 are differently tilted. Under these non-uniform DC magnetic field components, there is a risk that the external magnetic field might not completely be eliminated by simply supplying a common current to all the cancellation coils 2.

In the embodiment, the output value of the magnetic sensor 1 is compared with the reference voltage by the corresponding individual controller 31. The individual controller 31 includes an integrator circuit, and mainly detects the variance of a DC component between the magnetic sensors 1.

Then, regarding the direct current magnetic component, the DC component compensation coils 32 are supplied with the feedback drive current based on the results of comparison between the reference voltage and the output values of the magnetic sensors 1.

Thus, the non-uniform DC magnetic field components between the magnetic sensors 1 are removed. It is also possible to remove magnetic field components on the low-frequency side in a predetermined range by adjusting as appropriate the time constants of the integrator circuits included in the individual controllers 31.

The magnetic noise rejection apparatus 30 of the embodiment eliminates the DC components of the magnetic field from the target object as noise components, but leaves unremoved the alternating magnetic field components of the magnetic field from the target object, the frequencies of which exceed the time constants of the individual controllers 31. Thus, it is possible to preferably detect the alternating magnetic field components of the target object.

Fourth Embodiment

In the fourth embodiment, description is provided for an example where the magnetic noise rejection apparatuses described with reference to FIG. 3 to FIG. 10 are applied to the measurement of magnetic fields.

Figure 11:
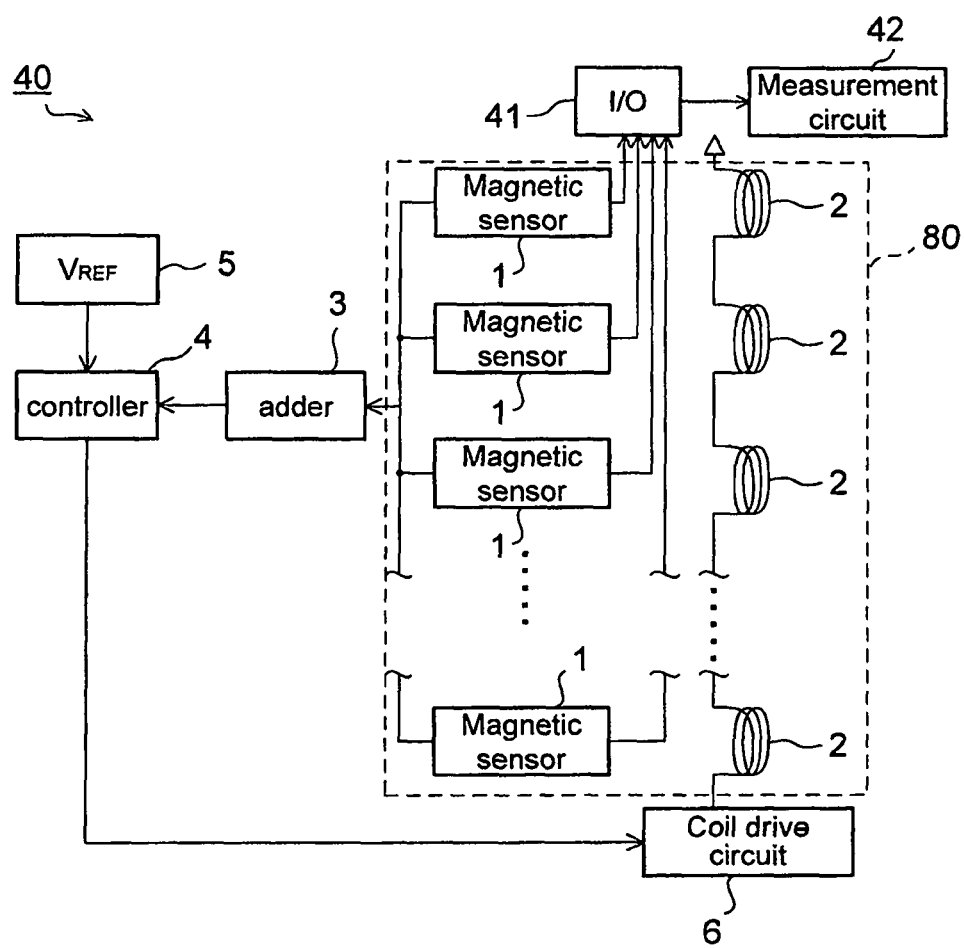
FIG. 11 is a block diagram of a magnetic field measurement apparatus according to a fourth embodiment.

FIG. 11 is a block diagram of a magnetic field measurement apparatus 40 according to a fourth embodiment.

Note that the components of the magnetic field measurement apparatus 40 the same as those of the magnetic noise rejection apparatus 10 of FIG. 7 are denoted by the same reference signs, and detailed description thereof is omitted.

As illustrated in FIG. 11, the basic configuration of the magnetic field measurement apparatus 40 of the embodiment is almost the same as that of the magnetic noise rejection apparatus 10 of FIG. 7, but is different in that the output of each magnetic sensor 1 is also supplied to a measurement circuit 42 via an input/output circuit 41.

The measurement circuit 42 detects the magnetic field from the target object 91 (see FIG. 3) by individually detecting the components of the outputs of the magnetic sensors 1 which would be eliminated when the sum is taken by, for example, the adder 3 noted above.

In addition, the measurement circuit 42 is capable of obtaining the distribution of the magnetic field inside the target object by performing analysis based on the information on the position of each magnetic sensor 1 and the intensity of the magnetic field.

The magnetic field measurement apparatus 40 of the embodiment is capable of removing the magnetic noise components and detecting the magnetic field from the measurement target object, using the magnetic sensors 1 equipped with the functions of the reference sensor and the detection sensor without having both of them separately unlike the conventional technology shown in FIG. 3.

Thus, it is possible to remove the magnetic noise components without a problem such as increase in the noise components when the external magnetic field is eliminated, and to measure the faint magnetic field generated from the target object without use of a large-scaled apparatus such as a shield room.

Note that the aspect of the magnetic field measurement apparatus 40 of the embodiment is not limited to that described above. For example, the configuration of the components for eliminating the external magnetic field may be an appropriate combination of the configurations illustrated in FIG. 8 to FIG.

Fifth Embodiment

Figure 12:
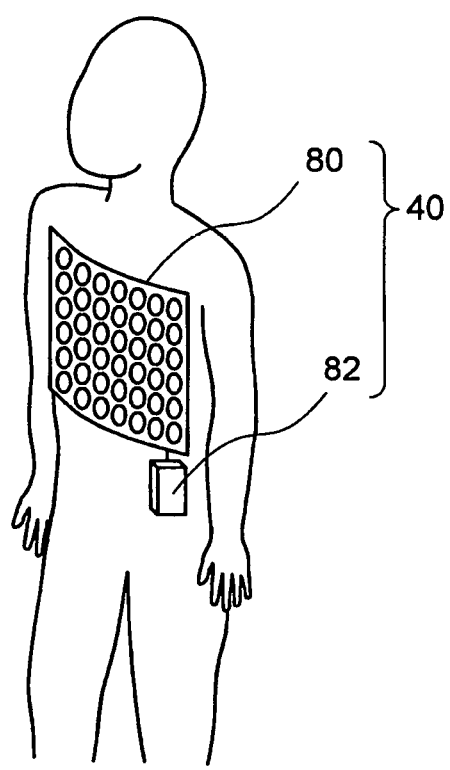
FIG. 12 is a diagram illustrating a method of measuring a magnetic signal generated from the heart according to a fifth embodiment.

FIG. 12 is a diagram illustrating an example where the magnetic field measurement apparatus 40 is applied to the measurement of the magnetic fields (magneto cardiogram) generated by the activity of the heart.

In this example, the sensor unit 80 equipped with the magnetic sensors 1 and the cancellation coils 2 is put on the user's body.

It is preferable that the sensors be arranged to cover a wide area on the chest of the user and to widely surround the heart as illustrated in the figure, such that the magnetic signals from the heart sum up to almost zero.

In addition, a control box 82 equipped with a control circuit is put on together with the sensor unit 80.

Thereafter, the magnetic field measurement apparatus 40 (see FIG. 11) initiates the measurement.

In other words, the sum of the outputs of the magnetic sensors 1 is taken, and the common components of the magnetic field applied to the magnetic sensors 1 are extracted.

Thereafter, the controller 4 compares the reference voltage under the zero magnetic field with the common components of the magnetic sensors 1 to supply a feedback current to the cancellation coils 2 via the coil drive circuit 6.

The feedback operation described above removes the magnetic noise components from the outside as the components common to the plurality of magnetic sensors 1, and under this condition, takes the output values of the magnetic sensors 1 into the measurement circuit 42 via the input/output circuit 41.

Thereafter, the information on the position of each magnetic sensor 1 and the detection value of each magnetic sensor 1 are separately obtained. Thereby, it is possible to measure the magnetic signals of the heart as the measurement target, the magnetic signals being separated from the magnetic noise components from the outside.

As described above, the magnetic field measurement apparatus 40 of the embodiment is capable of effectively removing external magnetic field noise, and measuring very faint magnetic signals such as the magnetic fields of the heart.

Sixth Embodiment

Figure 13:
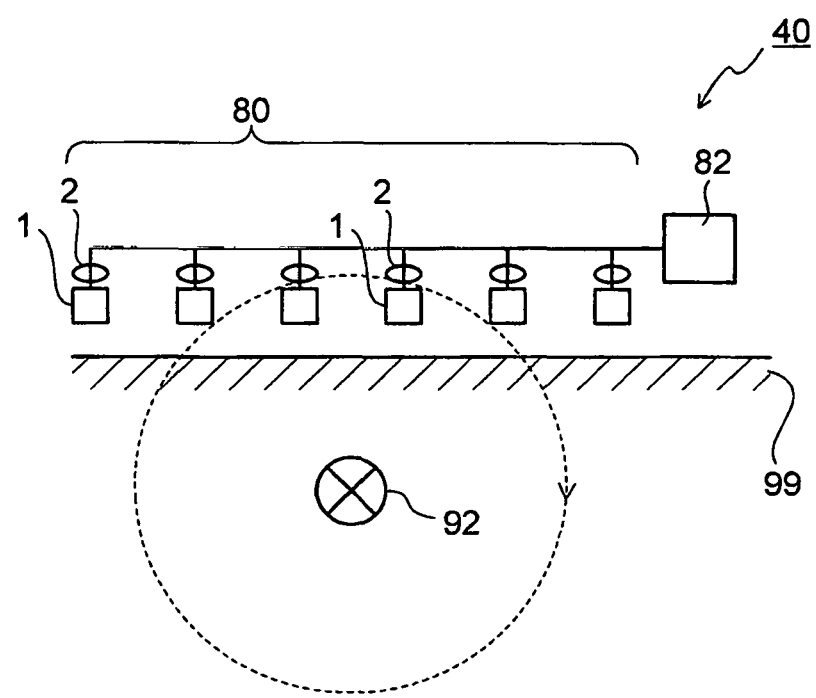
FIG. 13 is a diagram illustrating a method of detecting an object buried in the ground according to a sixth embodiment.

FIG. 13 is a diagram illustrating an example where the magnetic field measurement apparatus 40 is applied to the detection of an object buried in the ground.

In the embodiment, the sensor unit 80 equipped with the magnetic sensors 1 and the cancellation coils 2 is disposed near the surface of the ground 99, as illustrated in the figure. It suffices that the size of the sensor unit 80 is adjusted as appropriate in accordance with the size and the depth of a buried object 92 to be detected.

The magnetic field from the buried object 92 in the ground 99 is distributed as indicated by the dashed arrow in the figure. Hence, the magnetic field components from the buried object 92 are eliminated when the sum is taken over the plurality of magnetic sensors 1, and there remain residual noise components such as the Earth's magnetic field.

The feedback drive current corresponding to the noise components is supplied from a control box 82 to the magnetic coils 2, thereby eliminating the components of the Earth's magnetic field.

Thereafter, it is possible to detect the buried object 92 based on the output signals from the magnetic sensors 1.

Seventh Embodiment

In a seventh embodiment, description is provided for a magnetic field measurement apparatus preferable for investigating the Earth's magnetic field and the like under the condition that the magnetic noise from the target object is relatively large.

Figure 14:
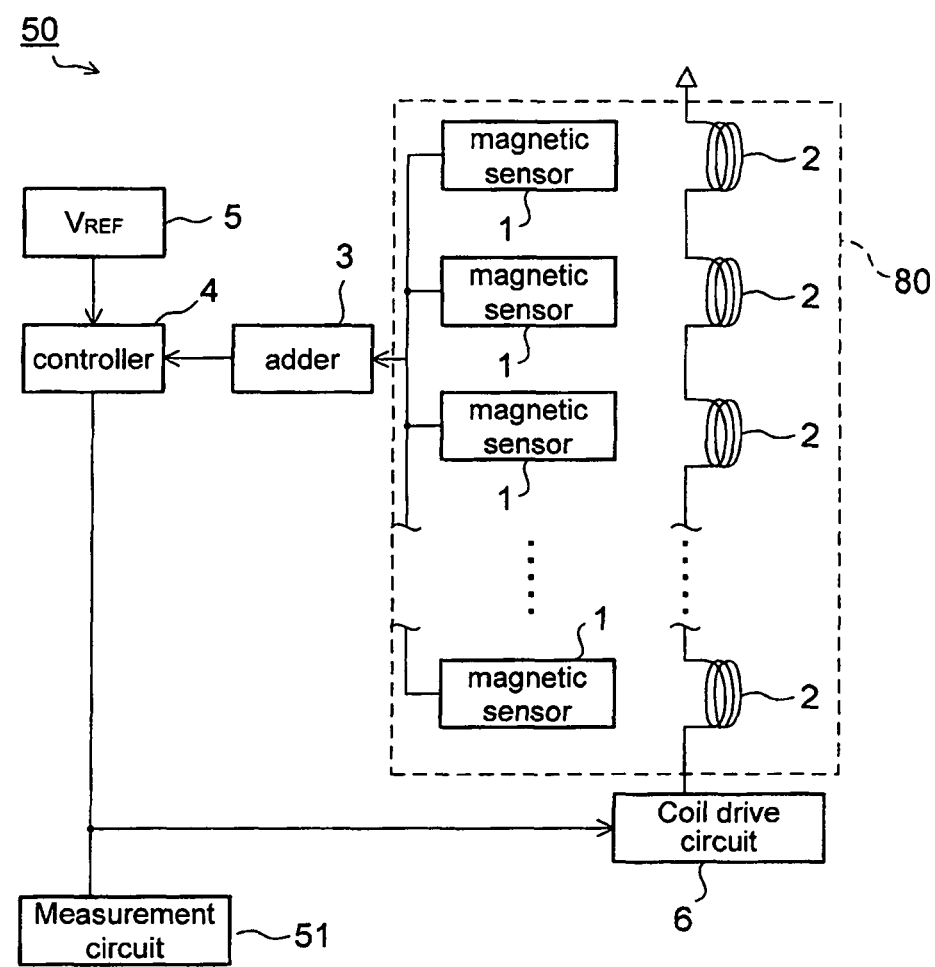
FIG. 14 is a block diagram of a magnetic field measurement apparatus according to a seventh embodiment.

FIG. 14 is a block diagram of a magnetic field measurement apparatus 50 according to the embodiment. Note that although the basic configuration of the magnetic field measurement apparatus 50 is almost the same as that of the magnetic noise rejection apparatus 10 of FIG. 7, the same components are denoted by the same reference signs, and detailed description thereof is omitted.

The magnetic field measurement apparatus 50 illustrated in FIG. 14 is different from the magnetic noise rejection apparatus 10 of FIG. 7 in that the output of the feedback output signal of the controller 4 is inputted to a measurement circuit 51.

Figure 15:
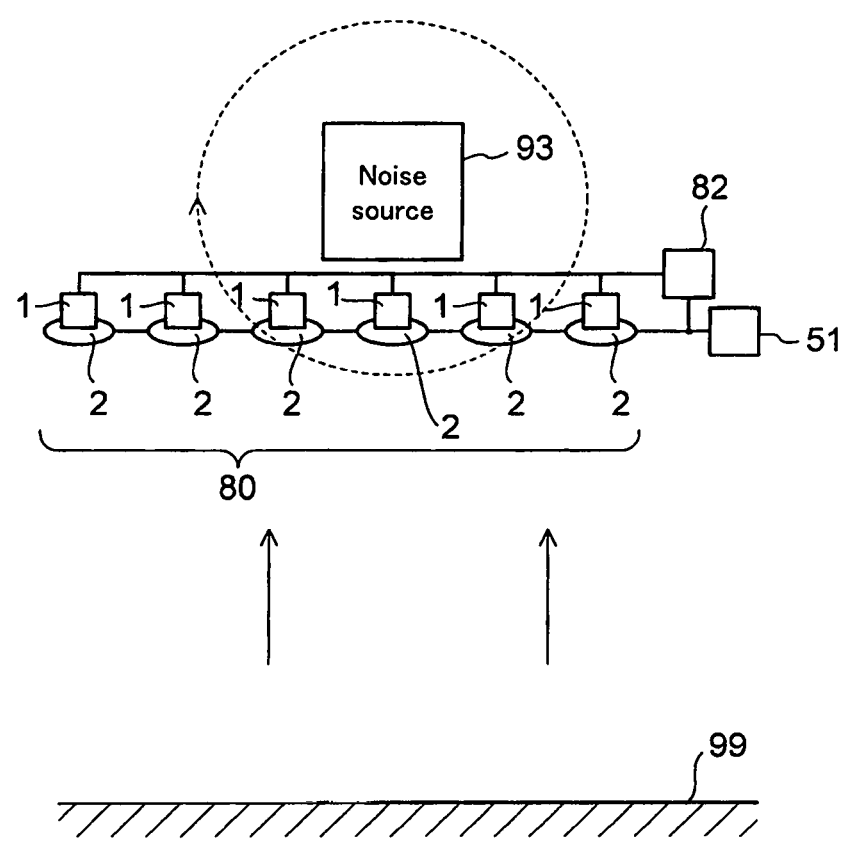
FIG. 15 is a diagram illustrating a position of a sensor unit of the magnetic field measurement apparatus of FIG. 14.

FIG. 15 is a diagram illustrating the position of the sensor unit 80 relative to a target object 93.

In the embodiment, as illustrated in FIG. 15, the magnetic sensors 1 and the cancellation coils 2 are arranged to cover the target object 93 as the noise source. In this arrangement, the magnetic field components from the target object 93 are eliminated when the outputs of the magnetic sensors 1 are summed up. As a result, the Earth's magnetic field components are left as a residual magnetic field.

Thus, in the magnetic field measurement apparatus 50 of FIG. 14, the Earth's magnetic field components, which are the residual components of the sum of the outputs of the magnetic sensors 1, are reflected on the feedback output signal to be outputted from the controller 4 to the coil drive circuit 6.

For this reason, the detection of the feedback output signal makes it possible to detect the magnetic field components from the outside such as the Earth's magnetic field without being affected by the noise components from the target object 93.

The magnetic field measurement apparatus 50 is applicable to, for example, a measurement apparatus for the Earth's magnetic field installed on an aircraft, an automobile, and the like, which receive large magnetic noise.

What is claimed is:

1. A magnetic noise rejection apparatus comprising:
   a plurality of cancellation coils arranged within a common plane near a target object, each cancellation coil being wound about an axis that is substantially perpendicular to the common plane, where the plurality of cancellation coils are connected in series, such that current is induced in a same direction in response to a change in magnetism, and driven by a current from a common drive circuit;
   a plurality of magnetic sensors, each magnetic sensor disposed substantially at a center of a respective cancellation coil, the each magnetic sensor being substantially smaller than the respective cancellation coil;
   an adder circuit connected to the plurality of magnetic sensors to produce a sum of outputs of the plurality of magnetic sensors; and
   a feedback control circuit connected to the adder circuit to supply the plurality of cancellation coils with a common feedback drive current so that the sum becomes equal to a sum of outputs of the plurality of magnetic sensors under a zero magnetic field.

2. The magnetic noise rejection apparatus according to claim 1, wherein
   the plurality of magnetic sensors operate by electric power supplied from a common power source.

3. The magnetic noise rejection apparatus according to claim 1, wherein
   compensation magnets are provided to the respective magnetic sensors, the compensation magnets compensate for offsets of the respective magnetic sensors.

4. The magnetic noise rejection apparatus according to claim 3, wherein each of the compensation magnets includes a coil and an adjustment circuit that adjusts a drive current to be supplied to the coil, and all of the adjustment circuits are operated by a drive current from a common power source.

5. The magnetic noise rejection apparatus according to claim 3, wherein
each of the compensation magnets includes a permanent magnet.

6. The magnetic noise rejection apparatus according to claim 1, further comprising:
a second feedback control circuit that moves a variance of a DC magnetic field component of the corresponding cancellation coil based on the output of each magnetic sensor.

7. The magnetic noise rejection apparatus according to claim 1, further comprising:
DC magnetic field compensation coils provided to the respective cancellation coils; and
an individual feedback control circuit that outputs a drive current to each of the DC magnetic field compensation coils based on a result of comparison between an output value of the corresponding magnetic sensor and a predetermined reference value, and that corrects a variance of DC magnetic field components between the magnetic sensors.

8. A magnetic field measurement apparatus comprising:
a plurality of cancellation coils arranged within a common plane near a target object, each cancellation coil being wound about an axis that is substantially perpendicular to the common plane, where the plurality of cancellation coils are connected in series, such that current is induced in a same direction in response to a change in magnetism, and driven by a current from a common drive circuit;
a plurality of magnetic sensors, each magnetic sensor disposed substantially at a center of a respective cancellation coil, each magnetic sensor being substantially smaller than the respective cancellation coil;
an adder circuit connected to the plurality of magnetic sensors to produce a sum of outputs of the plurality of magnetic sensors;
a feedback control circuit connected to the adder circuit to supply the plurality of cancellation coils with a common feedback drive current so that the sum becomes equal to a sum of outputs of the plurality of magnetic sensors under a zero magnetic field; and
a measurement circuit connected to the plurality of magnetic sensors to detect a magnetic field from an inside of the target object based on an output value of each magnetic sensor.

9. A magnetic field measurement apparatus comprising:
a plurality of cancellation coils arranged within a common plane near a target object, each cancellation coil being wound about an axis that is substantially perpendicular to the common plane, where the plurality of cancellation coils are connected in series, such that current is induced in a same direction in response to a change in magnetism, and driven by a current from a common drive circuit;
a plurality of magnetic sensors, each magnetic sensor disposed substantially at a center of a respective cancellation coil, each magnetic sensor being substantially smaller than the respective cancellation coil;
an adder circuit connected to the plurality of magnetic sensors to produce a total value of outputs of the magnetic sensors;
a feedback control circuit connected to the adder circuit to supply the plurality of cancellation coils with a common feedback drive current so that the total value becomes equal to a total value of outputs of plurality of the magnetic sensors under a zero magnetic field; and
a measurement circuit connected to the plurality of magnetic sensors to detect a magnetic field generated from a location away from the target object based on the common feedback drive current of the feedback control circuit.

* * * * *